United States Patent
Fujita et al.

(10) Patent No.: US 6,466,511 B2
(45) Date of Patent: Oct. 15, 2002

(54) SEMICONDUCTOR MEMORY HAVING DOUBLE DATA RATE TRANSFER TECHNIQUE

(75) Inventors: Katsuyuki Fujita, Yokohama (JP); Kaoru Nakagawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/894,362

(22) Filed: Jun. 28, 2001

(65) Prior Publication Data

US 2002/0003748 A1 Jan. 10, 2002

(30) Foreign Application Priority Data

Jun. 30, 2000 (JP) ........................................ 2000-200253

(51) Int. Cl.[7] .................................................. G11C 8/00
(52) U.S. Cl. ................................... 365/233; 365/230.06
(58) Field of Search ............................ 365/233, 230.06, 365/189.05

(56) References Cited

U.S. PATENT DOCUMENTS

| 5,587,954 A | 12/1996 | Vogley et al. | ............... 365/221 |
|---|---|---|---|
| 6,034,916 A | * 3/2000 | Lee | ............................ 365/233 |
| 6,134,180 A | * 10/2000 | Kim et al. | ................... 365/233 |
| 6,166,973 A | * 12/2000 | Shinozaki | ................... 365/233 |
| 6,324,118 B1 | * 11/2001 | Ooishi | ........................ 365/233 |
| 6,339,552 B1 | * 1/2002 | Taruismi et al. | ........ 365/189.05 |

FOREIGN PATENT DOCUMENTS

| JP | P4-125893 | 4/1992 |
|---|---|---|
| JP | P9-213065 | 8/1997 |

* cited by examiner

*Primary Examiner*—Tan T. Nguyen
(74) *Attorney, Agent, or Firm*—Frommer Lawrence & Haug LLP; Grace L. Pan

(57) ABSTRACT

The semiconductor memory includes a memory cell which handles a clock signal, an address fetch and a command circuit. The memory cell is designated by an address signal and stores data. The clock signal is supplied thereto so as to provide timing for an access to the memory cell, and the clock signal has a leading edge and a trailing edge. The address fetch circuit fetches the address signal for designating the memory cell in synchronism with both of the leading edge and trailing edge of the clock signal. The command circuit fetches a command signal for instructing the access to the memory cell in synchronism with both of the leading edge and the trailing edge of the clock signal.

17 Claims, 9 Drawing Sheets

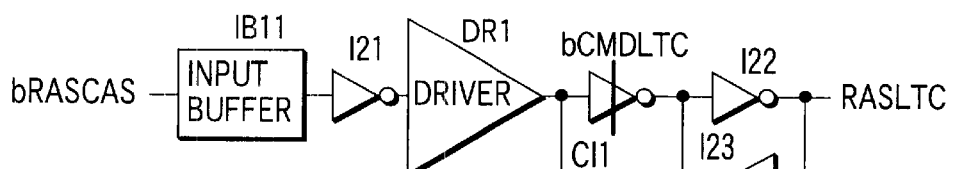
FIG. 7A
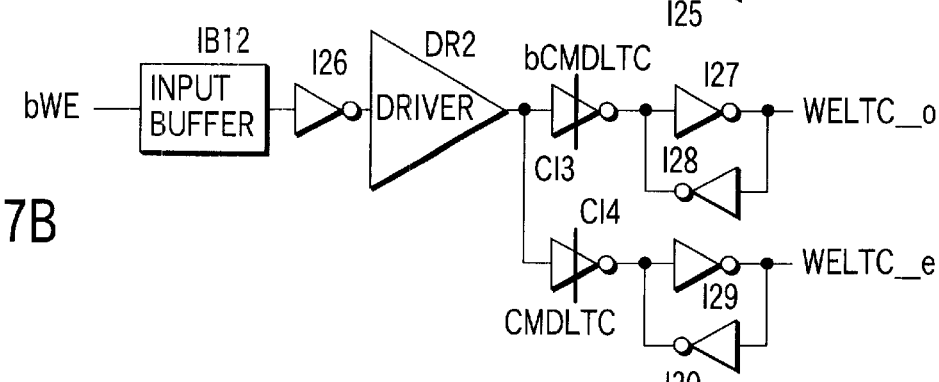
FIG. 7B
FIG. 7C
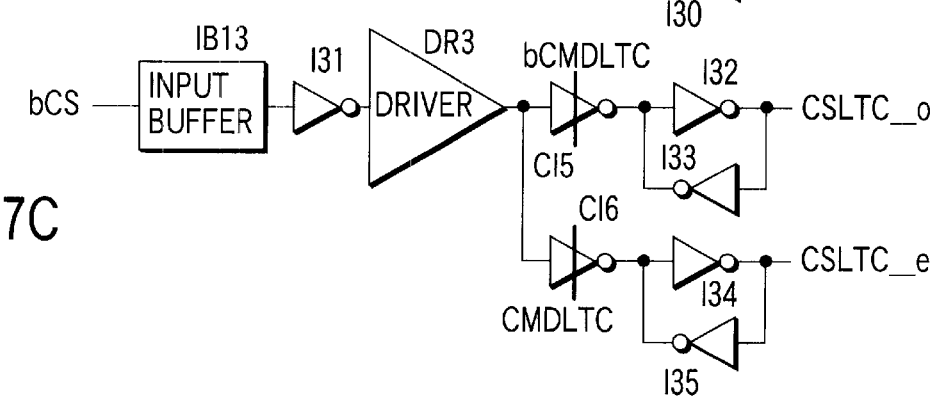
FIG. 7D
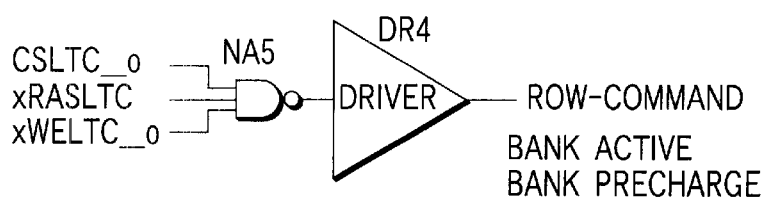
FIG. 7E
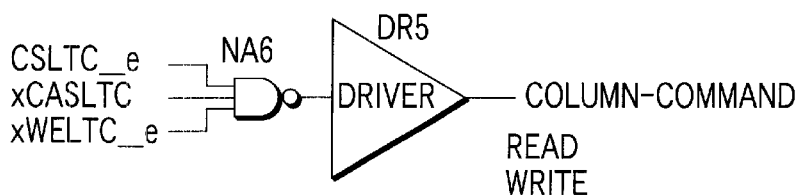

SEMICONDUCTOR MEMORY HAVING DOUBLE DATA RATE TRANSFER TECHNIQUE

CROSS-REFERENCE TO RELATED APPLICATIONS

This application is based upon and claims the benefit of priority from the prior Japanese Patent Application No. 2000-200253, filed Jun. 30, 2000, the entire contents of which are incorporated herein by reference.

BACKGROUND OF THE INVENTION

1. Field of the Invention

The present invention relates to a semiconductor memory, and more specifically to a semiconductor memory having a DDR (double data rate) transfer technique.

2. Description of the Related Art

Recently, there are greatly increasingly demands on improving the processing speed of computer systems. In order to meet such demands, a synchronous DRAM (DDR-SDRAM) is presently being developed. The synchronous DRAM uses a DDR (double data rate) transfer technique, which transfers data between the memory and the CPU effectively at double the speed of a conventional technique, by synchronizing the transfer of data in synchronism with both of the leading edge and trailing edge of clock signals supplied for controlling the operation timing.

In the conventional synchronous DRAM (DDR-SDRAM), data is input/output by a DDR operation; however, various signals such as a row address strobe signal bRAS, a column address strobe signal bCAS, a chip select signal bCS, write enable signal bWE, bank select signals (BS0 and BS1), and row (column) address signals (A0 to A11) are not handled by the DDR operation. It should be noted that the first letter of each reference symbol, that is, b, indicates that the signal is of an inverted type.

Further, signals of row addresses and column addresses share address basses, input pins, input buffers and the like, and therefore they cannot be inputted at the same time.

Due to the two points described above, there is the following problem. That is, gaps are created while transferring data, thereby deteriorating the effective data transfer rate, particularly in the case where random row accessing is carried out.

FIG. 1 is a diagram illustrating a read-out operation in an interleave where the latency of the CAS signal is 2, the burst length is 4 and the number of banks is 4 and FIG. 2 is a diagram illustrating a write operation in an interleave where the latency of the CAS signal is 2, the burst length is 4 and the number of banks is 4. Further, FIG. 3 is a diagram illustrating a read-out operation in an interleave where the latency of the CAS signal is 2, the burst length is 2 and the number of banks is 4 and FIG. 4 is a diagram illustrating a write operation in an interleave where the latency of the CAS signal is 2, the burst length is 2 and the number of banks is 4.

In order for avoiding such a problem that the data transfer rate described above is deteriorated, there is a technique which prepares address buses, input pins, input buffers and the like are provided separately and exclusively for row address and column address. According to this technique, row address and column address are input at the same time, and therefore the above-described problem can be easily solved. However, with this technique, the necessary area for forming address buses, input pins, input buffers and the like will become twice as large, thereby increasing the chip area. Therefore, it is difficult to put it into practice.

BRIEF SUMMARY OF THE INVENTION

The present invention has been proposed in consideration of the above-described problems entailed to the conventional technique, and the object thereof is to provide a semiconductor memory capable of enhancing the data transfer efficiency and increasing the circuit operation speed without increasing its chip area.

In order to achieve the above-described object, there is provided, according to the first aspect of the present invention, a semiconductor memory comprising: a memory cell for storing data, the memory cell being designated by an address signal; an address fetch circuit for fetching the address signal for designating the memory cell in synchronism with both of a leading edge and a trailing edge of a clock signal, the clock signal for providing timing for access to the memory cell; and a command circuit for fetching a command signal for instructing the access to the memory cell in synchronism with both of the leading edge and the trailing edge of the clock signal.

In order to achieve the above-described object, there is provided according to the second aspect of the present invention, a semiconductor memory comprising: a memory cell for storing data, the memory cell being designated by an address signal; a clock generating circuit for generating a clock signal used for providing timing for an access to the memory cell, the clock signal having a leading edge and a trailing edge; a first holding circuit for holding the address signal for designating the memory cell in synchronism with either one of a leading edge and a trailing edge of the clock signal; a second holding circuit for holding the address signal in synchronism with an other edge which comes after the one of edges, which is different from the one of the edges, used by the first holding circuit to hold the address signal; a first decoding circuit for decoding the address signal held by the first holding circuit; and a second decoding circuit for decoding the address signal held by the second holding circuit.

In order to achieve the above-described object, there is provided, according to the third aspect of the present invention, a semiconductor memory comprising: a memory cell for storing data; a clock generating circuit for generating a clock signal used for providing timing for an access to the memory cell, the clock signal having a leading edge and a trailing edge;

a first holding circuit for holding a command signal for instructing the access to the memory cell in synchronism with either one of the leading edge and the trailing edge of the clock signal; a second holding circuit for holding the command signal in synchronism with an other edge which comes after the one of edges, which is different from the one of the edges, used by the first holding circuit to hold the command; a first decoding circuit for decoding the command signal held by the first holding circuit; and a second decoding circuit for decoding the command signal held by the second holding circuit.

With the semiconductor memory having the above-described structure, not only input/output of data, but also the command signals, that is, the address signal, bank selection signal, row address strobe signal bRAS, column address strobe signal bCAS, chip select signal bCS and write enable signal bWE, are fetched in synchronism with both of the leading edge (the rising edge) and the trailing edge (the falling edge) of the clock signal. In this manner, it becomes possible to improve the effective data transfer rate. Further, not simply fetching these signals in synchronism with both of the leading edge and the trailing edge of the clock signal, but each signal is handled in accordance with its role of the signal, that is, for example, the handling of some signals is limited such that they are fetched in synchronism with leading edges of external clock signals, while others are fetched in synchronism with trailing edges of external clock signals. In this manner, the number of signals input from outside can be reduced. Thus, the circuit can be simplified in structure, and the chip area can be reduced and the circuit operation speed can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 7A to 7E are circuit diagrams illustrating a structure of a command portion in the semiconductor memory;

DETAILED DESCRIPTION OF THE INVENTION

Embodiments of the present invention will now be described with reference to accompanying drawings.

Figure 1:
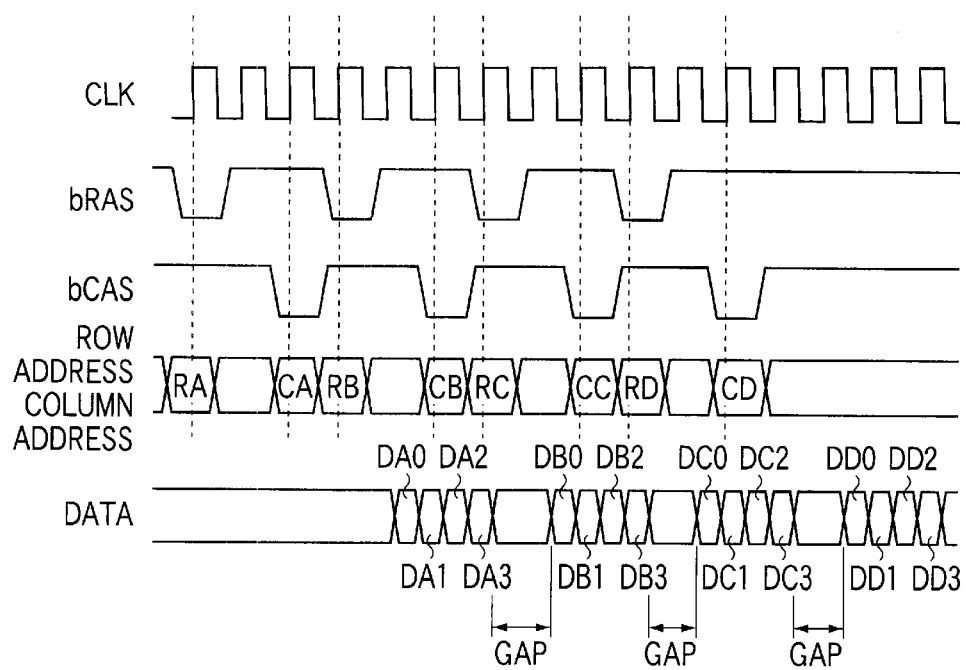
FIG. 1 is a time chart indicating an example of the read operation in a conventional synchronous DRAM.
Figure 2:
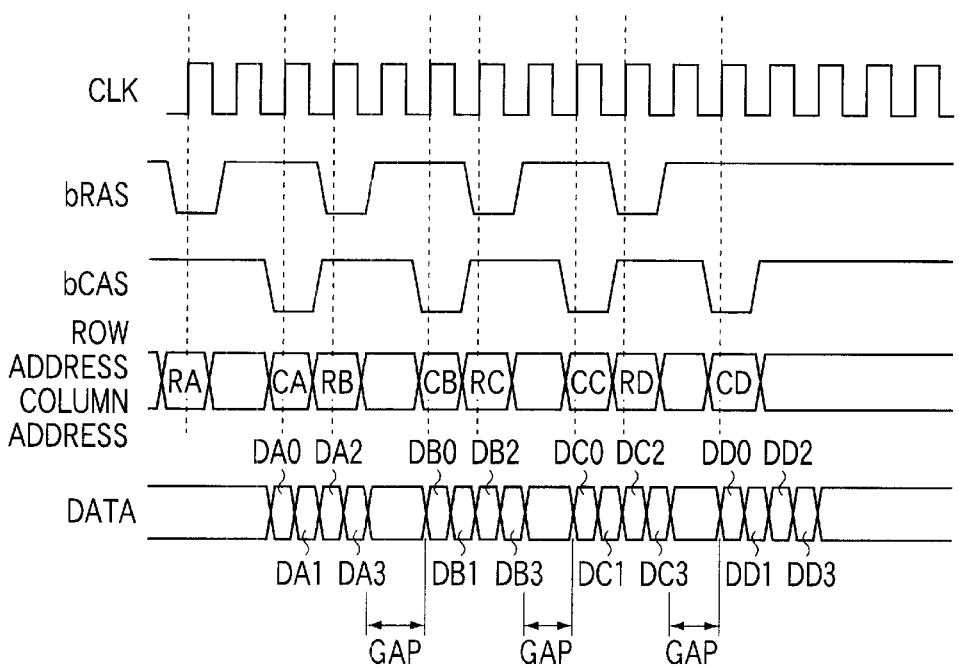
FIG. 2 is a time chart indicating an example of the write operation in a conventional synchronous DRAM.
Figure 3:
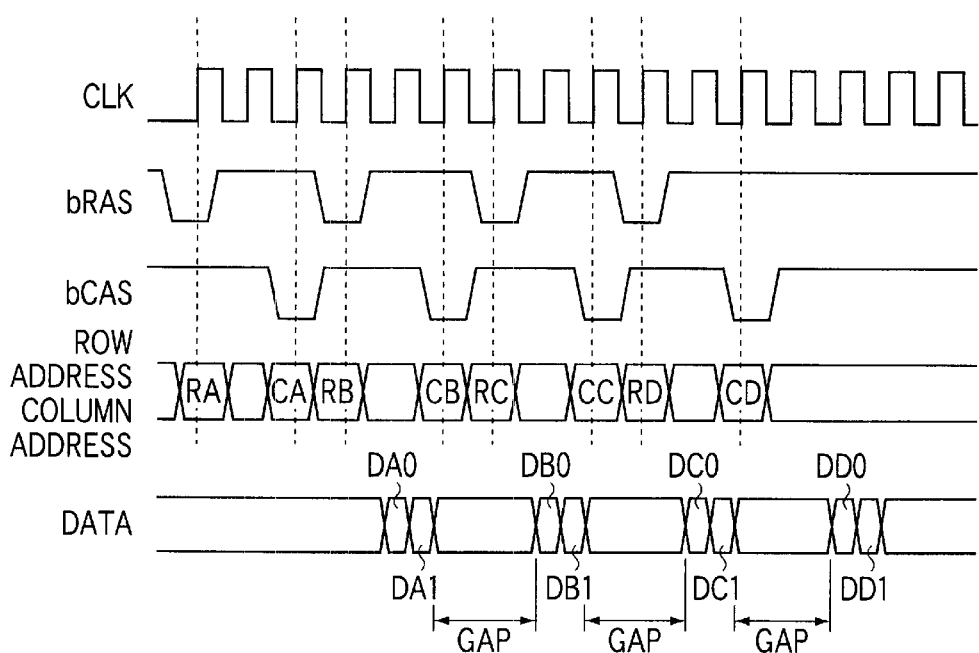
FIG. 3 is a time chart indicating an example of the read operation in another conventional synchronous DRAM.
Figure 4:
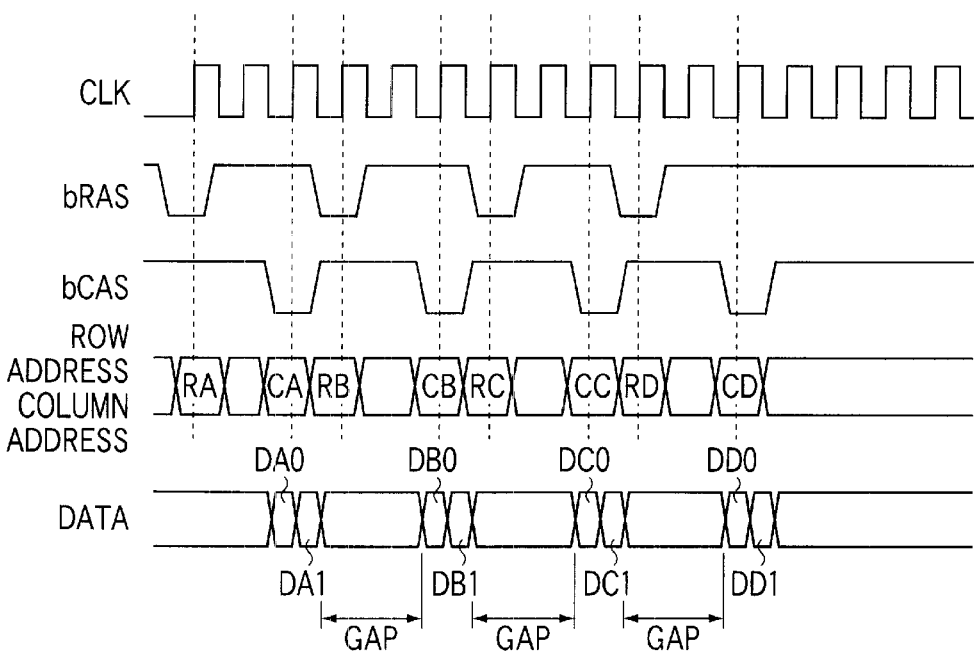
FIG. 4 is a time chart indicating an example of the write operation in another conventional synchronous DRAM.
Figure 5:
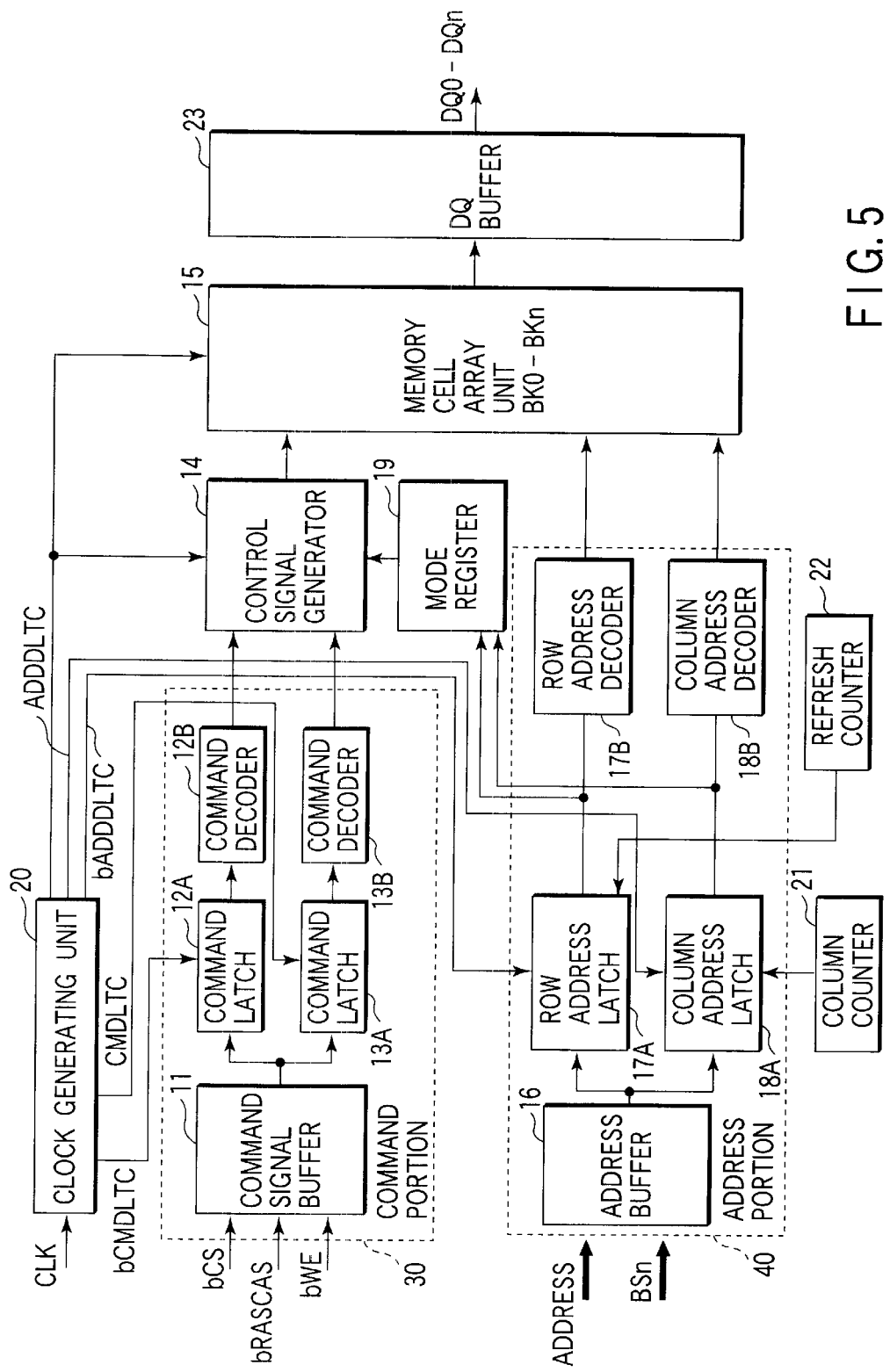
FIG. 5 is a block diagram showing a structure of a semiconductor memory according to an embodiment of the present invention.

FIG. 5 is a block diagram showing a structure of a semiconductor memory according to an embodiment of the present invention.

As can be seen in FIG. 5, an address strobe signal bRASCAS, a write enable signal bWE, and a chip select signal bCS are input to a command signal buffer 11. An output from the command signal buffer 11 is input to a command decoder 12B via a command latch 12A, as well as to a command decoder 13B via a command latch 13A.

Outputs from the command decoders 12B and 13B are both input to a control signal generator 14. An output from the control signal generator 14 is input to a bank block 15 including banks BK0 to BKn. Here, an example case where the bank block 15 includes banks BK0 to BK3, that is, the number of banks is 4, will be discussed. A bank is the minimum unit of a set of a plurality of memory cells which can be accessed to at the same time.

Address signals ADDRESS (A0 to A11) and bank select signals BSn (BS0 and BS1) are input to an address buffer 16. An output from the address buffer 16 is input to each of the row address latch 17A and column address latch 18A. An output from the row address latch 17A is input to the mode register 19 as well as to the bank block 15 via a row address decoder 17B. Similarly, an output from the column address latch 18A is input to the mode register 19 as well as to the bank block 15 via a column address decoder 18B.

From an outside member, a clock signal CLK is input to a clock generating portion 20. A clock signal bCMDLTC is output from the clock generating portion 20 to the command latch 12A. Also, a clock signal CMDLTC is output from the clock generating portion 20 to a command latch 13A. Further, a clock signal ADDDLTC is output from the clock generating portion 20 to the row address latch 17A. A clock signal bADDDLTC is output from the clock generating portion 20 to the column address latch 18A. Further, a clock signal output from the clock generating portion 20 is input to each of the control signal generator 14 and the memory cell array portion (bank block) 15.

An output from a column counter 21 is input to the column address latch 18A. An output from a refresh counter 22 is input to the row address latch 17A. Meanwhile, data DQ0 to DQn are output from the memory cell array portion 15 via a DQ buffer 23. The memory cell array portion 15 has banks BK0 to BK3.

It should be noted that the command signal buffer 11, the command latch 12A, the command decoder 12B, the command latch 13A and the command decoder 13B constitute a command portion 30. Further, the address buffer 16, the row address latch 17A, the column address latch 18A, the row address decoder 17B and the column address decoder 18B constitute an address portion 40.

The clock generating portion 20 generates a clock signal bCMDLTC and a signal CMDLTC, which are used in the command portion 30, and a clock signal bADDDLTC and a signal ADDDLTC, which are used in the address portion 40. The clock signal bCMDLTC and signal CMDLTC are used to synchronize the start of operations in the command portion 30, and the clock signal bADDDLTC and signal ADDDLTC are used the start of operations in the address portion 40.

The command portion 30 latches each of the address strobe signal bRASCAS, write enable signal bWE, chip select signal bCS, which are input to the command signal buffer 11, in the command latch 12A in synchronism with the clock signal bCMDLTC, and then outputs each of the latched signals to the command decoder 12B. The command decoder 12B decodes each of the input signals, and outputs a signal ROW-COMMAND for carrying out an arbitrary row-series circuit operation.

Further, the command portion 30 latches each of the address strobe signal bRASCAS, write enable signal bWE, chip select signal bCS, which are input to the command signal buffer 11, in the command latch 13A in synchronism with the clock signal CMDLTC, and then outputs each of the latched signals to the command decoder 13B. The command decoder 13B decodes each of the input signals, and outputs a signal COLUMN-COMMAND for carrying out an arbitrary column-series circuit operation.

The address portion 40 latches the address signal ADDRESS input to the Gommand buffer 16, in the row address latch 17A in synchronism with the clock signal bADDDLTC, and then outputs the latched signal ROW-ADDRESS to the row address decoder 17B. The row address decoder 17B decodes the input signal ROW-ADDRESS, and activates an arbitrary row-address selection line.

Further, the address portion 40 latches the address signal ADDRESS input to the command buffer 16, in the column address latch 18A in synchronism with the clock signal ADDDLTC, and then outputs the latched signal COLUMN-ADDRESS to an address decoder (not shown). The address decoder decodes the input signal COLUMN-ADDRESS, and activates an arbitrary column-address selection line.

Furthermore, the address portion 40 latches the bank select signal BSn input to the command buffer 16, in a latch circuit (not shown) in synchronism with the clock signal bADDDLTC and signal ADDDLTC. Then, it decodes the latched signal in a decoder (not shown), and outputs a signal BS<0:3> for selecting a bank.

Next, the circuit structures of the clock generating portion 20, the command portion 30 and the address portion 40 will now be described in detail with reference to FIGS. 6A to 6E, FIGS. 7A to 7E and FIGS. 8A to 8C. FIG. 9 is a time chart illustrating operations of the clock generating portion 20, the command portion 30 and the address portion 40.

FIGS. 6A to 6E are circuit diagrams showing a structure of the clock generating portion 20.

Figure 6A:
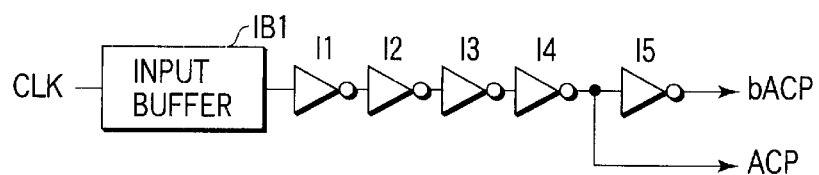
FIGS. 6A to 6E are circuit diagrams illustrating a structure of a clock generating portion in the semiconductor memory.

As shown in FIG. 6A, the clock signal CLK input to the input buffer IB1 passes through inverters I1, I2, I3 and I4, and is output from an output portion of the inverter I4 as a clock signal ACP. Further, the signal ACP passes through an inverter I5, and then is output as a clock signal bACP. Waveforms of these clock signals CLK, clock signal ACP and clock signal bACP are as shown in FIG. 9.

Figure 6B:
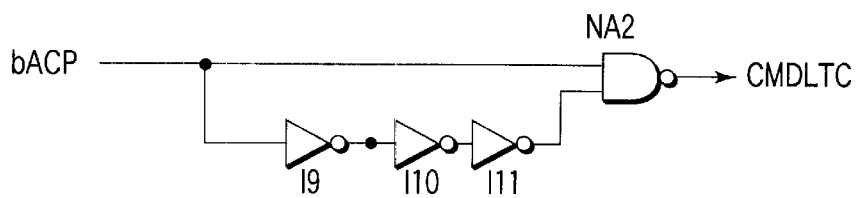
Figure 6C:
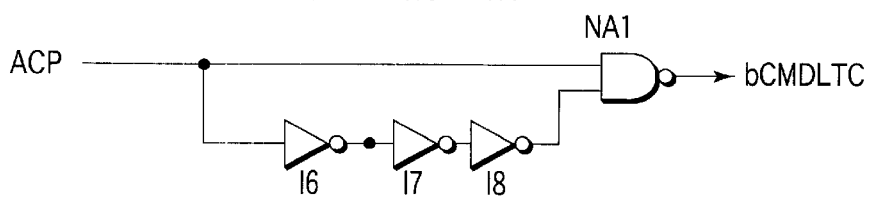

Further, as shown in FIG. 6C, the clock signal ACP is input to a first terminal of an NAND circuit NA1 and also to a second terminal of the NAND circuit NA1 via inverters I6, I7 and I8. A clock signal bCMDLTC is output from an output portion of the NAND circuit NA1. As shown in FIG. 6B, the clock signal bACP is input to a first terminal of an NAND circuit NA2 and also to a second terminal of the NAND circuit NA2 via inverters I9, I10 and I11. A clock signal CMDLTC is output from an output portion of the NAND circuit NA2. Waveforms of these clock signals bCMDLTC and clock signal CMDLTC are as shown in FIG. 9.

Figure 6D:
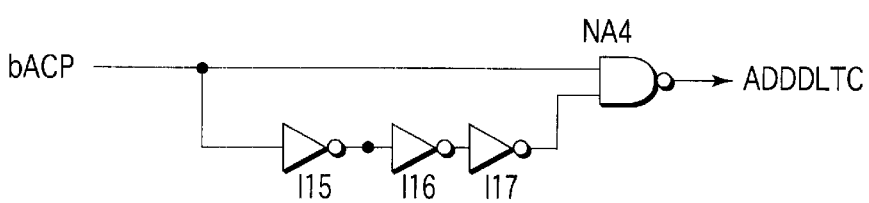
Figure 6E:
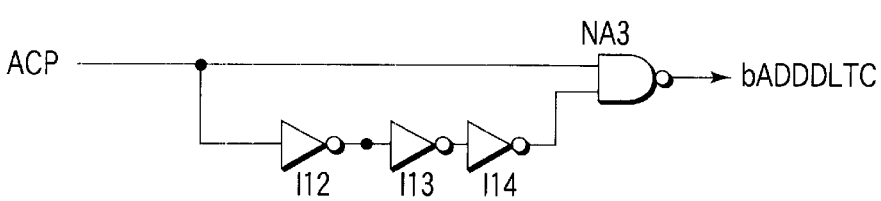

Furthermore, as shown in FIG. 6E, the clock signal ACP is input to a first terminal of an NAND circuit NA3 and also to a second terminal of the NAND circuit NA3 via inverters I12, I13 and I14. A clock signal bADDDLTC is output from an output portion of the NAND circuit NA3. As shown in FIG. 6D, the clock signal bACP is input to a first terminal of an NAND circuit NA4 and also to a second terminal of the NAND circuit NA4 via inverters I15, I16 and I17. A signal ADDDLTC is output from an output portion of the NAND circuit NA4. Waveforms of these clock signals bADDDLTC and clock signal ADDDLTC are as shown in FIG. 9.

FIGS. 7A to 7E are circuit diagrams showing a structure of the command portion 30.

First, circuit structures of a command signal buffer 11 and command latches 12A and 13A in the command portion 30 will be described.

As shown in FIG. 7A, the address strobe signal bRASCAS input to an input buffer IB11 is input to a driver DR1 via an inverter I21. An output from the driver DR1 is input to an inverter I22 and an inverter I23, which constitute a latch circuit, via a clocked inverter CI1, and a signal RASLTC is output from an output portion of the latch circuit. An output from the driver DR1 is input via a clocked inverter CI2 to an inverter I24 and an inverter I25 which constitute a latch circuit. A signal CASLTC is output from an output portion of this latch circuit. It should be noted that a signal bCMDLTC is input to a control terminal of the clocked inverter CI1 and a signal CMDLTC is input to a control terminal of the clocked inverter CI2.

In the circuit shown in FIG. 7A, when an "L" level of a signal bRASCAS is input to the input buffer IB11, the signal is inverted by the inverter I21 to an "H" level, which is then supplied to an input portion of the clocked inverter CI1 via the driver DR1. The clocked inverter CI1 is activated only when the signal bCMDLTC input to the control terminal is at an "L" level, and an "H" level signal supplied to the input portion is inverted to an "L" level, which is then supplied to the latch circuit consisting of the inverters I22 and I23. This latch circuit inverts the "L" level signal supplied there to an "H" level, which is output as a signal RASLTC. It should be noted that the signal bCMDLTC input to the control terminal of the clocked inverter CI1 is at an "H" level, an output from the clocked inverter CI1 is in a high impedance state, and no signal is output from the output portion. Therefore, the signal latched in the latch circuit is output directly as a signal RASLTC.

The "H" level signal output from the inverter I21 is supplied to the input portion of the clocked inverter CI2 via the driver DR1. The clocked inverter CI2 is activated only when the signal CMDLTC input to the control terminal is at an "L" level, and an "H" level signal supplied to the input portion is inverted to an "L" level, which is then supplied to the latch circuit consisting of the inverters I24 and I25. This latch circuit inverts the "L" level signal supplied there to an "H" level, which is output as a signal CASLTC. It should be noted that the signal CMDLTC input to the control terminal of the clocked inverter CI2 is at an "H" level, no signal is output from the output portion of the clocked inverter CI2. Therefore, the signal latched in the latch circuit is output directly as a signal CASLTC.

As shown in FIG. 7B, the signal bWE input to an input buffer IB12 is input to a driver DR2 via an inverter I26. An output from the driver DR2 is input to an inverter I27 and an inverter I28, which constitute a latch circuit, via a clocked inverter CI3, and a signal WELTC-o is output from an output portion of the latch circuit. An output from the driver DR2 is input via a clocked inverter CI4 to an inverter I29 and an inverter I30 which constitute a latch circuit. A signal WELTC-e is output from an output portion of this latch circuit. It should be noted that a signal bCMDLTC is input to a control terminal of the clocked inverter CI3 and a signal CMDLTC is input to a control terminal of the clocked inverter CI4.

In the circuit shown in FIG. 7B, when an "L" level of a signal bWE is input to the input buffer IB12, the signal is inverted by the inverter I26 to an "H" level, which is then supplied to an input portion of the clocked inverter CI3 via the driver DR2. The clocked inverter CI3 is activated only when the signal bCMDLTC input to the control terminal is at an "L" level, and an "H" level signal supplied to the input portion is inverted to an "L" level, which is then supplied to the latch circuit consisting of the inverters I27 and I28. This latch circuit inverts the "L" level signal supplied there to an "H" level, which is output as a signal WELTC-o. It should be noted that the signal bCMDLTC input to the control terminal of the clocked inverter CI3 is at an "H" level, no signal is output from the clocked inverter CI3. Therefore, the signal latched in the latch circuit is output directly as a signal WELTC-o.

The "H" level signal output from the inverter I26 is supplied to the input portion of the clocked inverter CI4 via the driver DR2. The clocked inverter CI4 is activated only when the signal CMDLTC input to the control terminal is at an "L" level, and an "H" level signal supplied to the input portion is inverted to an "L" level, which is then supplied to the latch circuit consisting of the inverters I29 and I30. This latch circuit inverts the "L" level signal supplied there to an "H" level, which is output as a signal WELTC-e. It should be noted that the signal CMDLTC input to the control terminal of the clocked inverter CI4 is at an "H" level, no signal is output from the output portion of the clocked inverter CI4. Therefore, the signal latched in the latch circuit is output directly as a signal WELTC-e.

As shown in FIG. 7C, the signal bCS input to an input buffer IB13 is input to a driver DR3 via an inverter I31. An output from the driver DR3 is input to an inverter I32 and an inverter I33, which constitute a latch circuit, via a clocked inverter CI5, and a signal CSLTC-o is output from an output portion of the inverter I32. An output from the driver DR3 is input via a clocked inverter CI6 to an inverter I34 and an inverter I35 which constitute a latch circuit. A signal CSLTC-e is output from an output portion of the inverter I34. It should be noted that a signal bCMDLTC is input to a control terminal of the clocked inverter CI5 and a signal CMDLTC is input to a control terminal of the clocked inverter CI6.

In the circuit shown in FIG. 7C, when an "L" level of a signal bCS is input to the input buffer IB13, the signal is inverted by the inverter I31 to an "H" level, which is then supplied to an input portion of the clocked inverter CI5 via the driver DR3. The clocked inverter CI5 is activated only when the signal bCMDLTC input to the control terminal is at an "L" level, and an "H" level signal supplied to the input portion is inverted to an "L" level, which is then supplied to the latch circuit consisting of the inverters I32 and I33. This latch circuit inverts the "L" level signal supplied there to an "H" level, which is output as a signal CSLTC-o. It should be noted that the signal bCMDLTC input to the control terminal of the clocked inverter CI5 is "H", no signal is output from the clocked inverter CI5. Therefore, the signal latched in the latch circuit is output directly as a signal CSLTC-o.

The "H" level signal output from the inverter I31 is supplied to the input portion of the clocked inverter CI6 via the driver DR3. The clocked inverter CI6 is activated only when the signal CMDLTC input to the control terminal is at an "L" level, and an "H" level signal supplied to the input portion is inverted to an "L" level, which is then supplied to the latch circuit consisting of the inverters I34 and I35. This latch circuit inverts the "L" level signal supplied there to an "H" level, which is output as a signal CSLTC-e. It should be noted that the signal CMDLTC input to the control terminal of the clocked inverter CI6 is at an "H" level, no signal is output from the output portion of the clocked inverter CI6. Therefore, the signal latched in the latch circuit is output directly as a signal CSLTC-e.

In the circuits shown in FIGS. 7A to 7C, when "H" levels of a signal bRASCAS, a signal bWE and a signal bCS are input to each of the input buffers IB11 to IB13, the signals of these portions each will have an opposite polarity, and "L" levels of a signal RASLTC, a signal CASLTC, a signal WELTC-o, a signal WELTC-e, a signal CSLTC-o and a signal CSLTC-e are output. It should be noted that the operation of each of the clocked inverters CI1 to CI6 to which the signal bCMDLTC or signal CMDLTC is input is the same as that described above.

Next, the circuit structures of the command decoders 12B and 13B in the command portion 30 will now be described.

As shown in FIG. 7D, a signal CSLTC-o is input to the first terminal of a NAND circuit NA5. A signal xRASLTC is input to the second terminal thereof and a signal xWELTC-o is input to the third terminal thereof. An output from the NAND circuit NA5 is output as a signal ROW-COMMAND via a driver DR4. Signals xRASLTC and xWELTC-o input to the second and third terminal of the NAND circuit NA5 indicates that they are of one of those types which are logically inverting each of the signals RASLTC and WELTC-o by an inverter or not logically inverting each of these signals.

There are provided the corresponding number of command decoders having the above-described structure, to that of the number of the row commands. Only in the case where all of the signals CSLTC-o, xRASLTC and xWELTC-o are at an "H" level, the signal ROW-COMMAND becomes an "L" level, and commands such as "BANK ACTIVE" and "BANK PRECHARGE" become active.

Further, as shown in FIG. 7E, a signal CSLTC-e is input to the first terminal of a NAND circuit NA6. A signal xCASLTC is input to the second terminal thereof and a signal xWELTC-e is input to the third terminal thereof. An output from the NAND circuit NA6 is output as a signal COLUMN-COMMAND via a driver DR5. Signals xCASLTC and xWELTC-e input to the second and third terminal of the NAND circuit NA6 indicates that they are of one of those types which are logically inverting each of the signals CASLTC and WELTC-e by an inverter or not logically inverting each of these signals.

There are provided the corresponding number of command decoders having the above-described structure, to that of the number of the column commands. Only in the case where all of the signals CSLTC-e, xCASLTC and xWELTC-e are at an "H" level, the signal COLUMN-COMMAND becomes an "L" level, and commands such as "READ" and "WRITE" become active.

It should be noted that, in the above-description, in the case where all of the signals CSLTC-o, RASLTC and WELTC-o input to the NAND circuit NA5 are at an "H" level, commands are selected; however alternatively, it is also possible to select commands when all of these signals are at an "L" level. Here, it is necessary to replace the NAND circuit NA5 with a NOR circuit. Similarly, in the above-description, in the case where all of the signals CSLTC-e, CASLTC and WELTC-e input to the NAND circuit NA6 are at an "H" level, commands are selected; however alternatively, it is also possible to select commands when all of these signals are at an "L" level. Here, it is necessary to replace the NAND circuit NA6 with a NOR circuit.

Figure 8A:
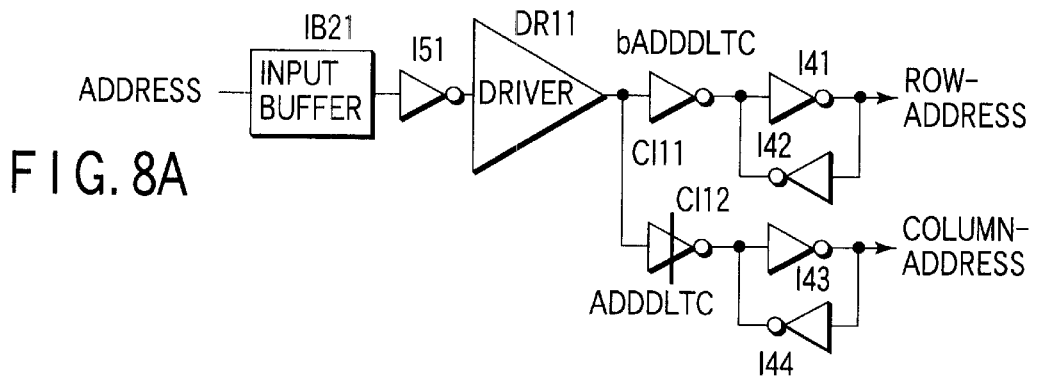
FIGS. 8A to 8C are circuit diagrams illustrating a structure of an address portion in the semiconductor memory.
Figure 8B:
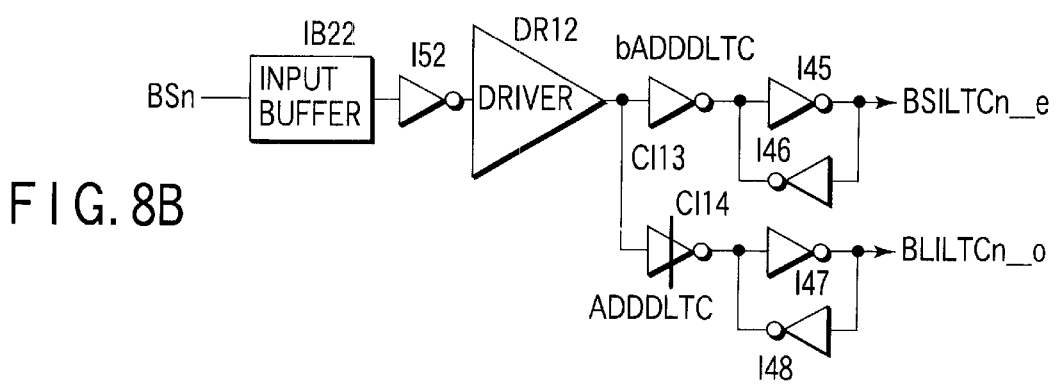
Figure 8C:
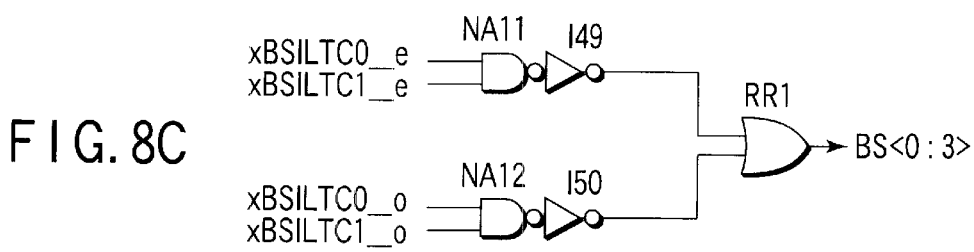
Figure 9:
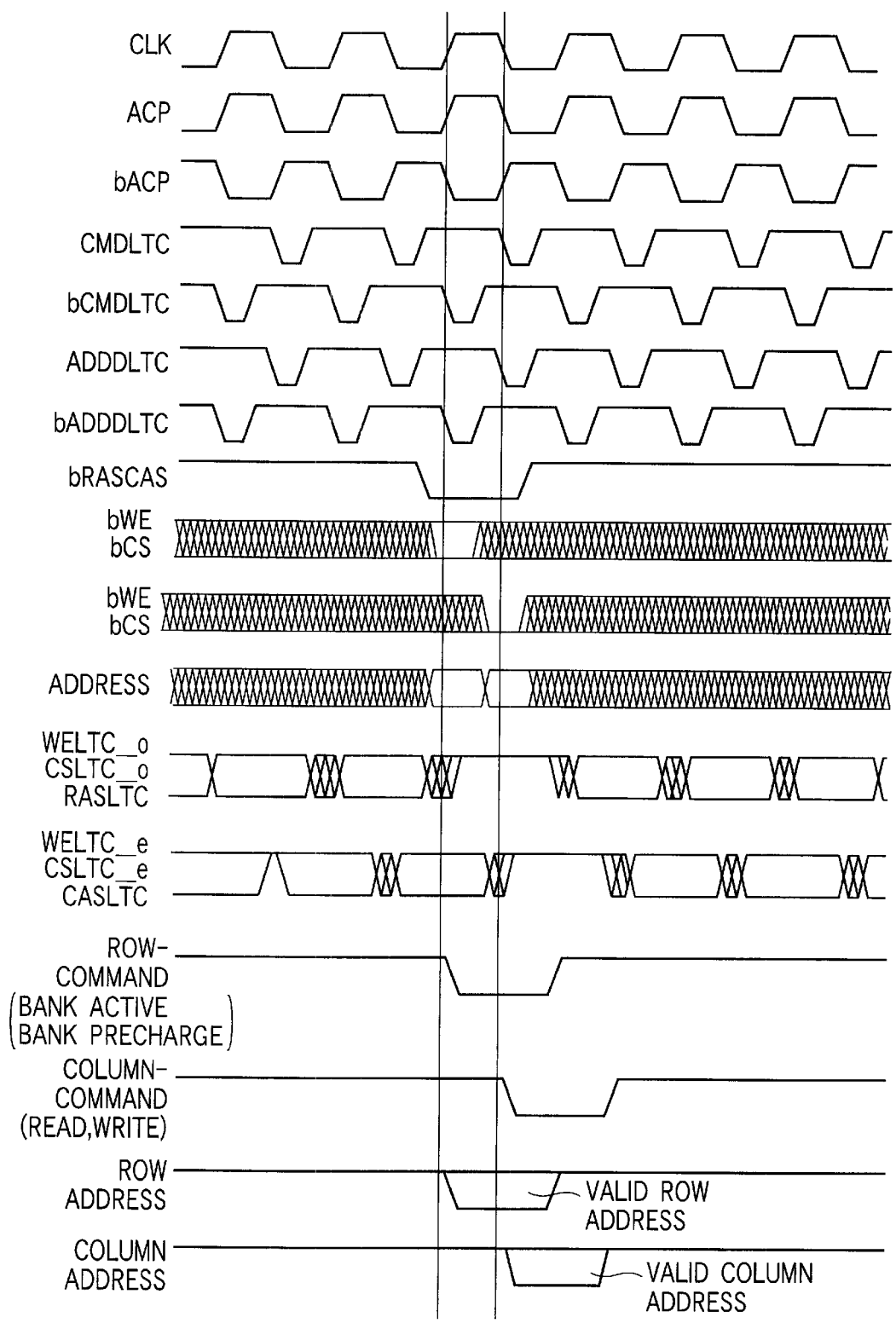
FIG. 9 is a time chart indicating operations of the clock generating portion, command portion and address portion in the semiconductor memory.

FIGS. 8A to 8C are circuit diagrams showing a structure of the address portion 40.

As shown in FIG. 8A, the address signal ADDRESS input to the input buffer IB21 from outside is input to a driver DR11 via an inverter I51. An output from the driver DR11 is input to the input section of the clocked inverter CI11. The clocked inverter CI11 is activated only when the signal bADDDLTC input to the control terminal is at an "L" level. The signal ADDRESS supplied to the input portion is inverted and the inverted signal is then supplied to the latch circuit consisting of inverters I41 and I42. This latch circuit inverts the signal supplied there, and then outputs a signal ROW-ADDRESS. It should be noted that the signal bADDDLTC input to the control terminal of the clocked inverter CI11 is at an "H" level, no signal is output from the clocked inverter CI11. Therefore, the signal latched in the latch circuit is output directly as a signal ROW-ADDRESS.

The signal ADDRESS supplied from the driver DR11 is supplied to the input portion of the clocked inverter CI12. The clocked inverter CI12 is activated only when the signal ADDRESS input to the control terminal is at an "L" level, and the signal ADDRESS input to the input portion is inverted and then supplied to the latch circuit consisting of the inverters I43 and I44. This latch circuit inverts the signal supplied there, and outputs a signal COLUMN-ADDRESS. It should be noted that the signal ADDDLTC input to the control terminal of the clocked inverter CI12 is at an "H" level, no signal is output from the output portion of the clocked inverter CI12. Therefore, the signal latched in the latch circuit is output directly as a signal COLUMN-ADDRESS.

Further, as shown in FIG. 8B, the bank select signal BSn input to the input buffer IB22 from outside is input to a driver DR12 via an inverter I52. An output from the driver DR12 is input to the input section of the clocked inverter CI13. The clocked inverter CI13 is activated only when the signal bADDDLTC input to the control terminal is at an "L" level. The signal supplied to the input portion is inverted and the inverted signal is then supplied to the latch circuit consisting of inverters I45 and I46. This latch circuit inverts the signal supplied there, and then outputs a signal BSILTCn-e. It should be noted that the signal bADDDLTC input to the control terminal of the clocked inverter CI13 is at an "H" level, no signal is output from the clocked inverter CI13. Therefore, the signal latched in the latch circuit is output directly as a signal BSILTCn-e.

The signal supplied from the driver DR12 is supplied to the input portion of the clocked inverter CI14. The clocked inverter CI14 is activated only when the signal ADDRESS input to the control terminal is at an "L" level, and the signal supplied to the input portion is inverted and then supplied to the latch circuit consisting of the inverters I47 and I48. This latch circuit inverts the signal supplied there, and outputs a signal BSILTCn-o. It should be noted that the signal ADDDLTC input to the control terminal of the clocked inverter CI14 is at an "H" level, no signal is output from the output portion of the clocked inverter CI14. Therefore, the signal latched in the latch circuit is output directly as a signal BSILTCn-o.

Further, as shown in FIG. 8C, a clock signal xBSILTC0-e is input to a first terminal of an NAND circuit NA11 and a clock signal xBSILTC1-e is input to a second terminal thereof. A signal output from an output portion of the NAND circuit NA11 is input to a first terminal of an OR circuit RR1 via an inverter I49. A clock signal xBSILTC0-o is input to a first terminal of an NAND circuit NA12 and a clock signal xBSILTC1-o is input to a second terminal thereof. A signal output from an output portion of the NAND circuit NA12 is input to a second terminal of the OR circuit RR1 via an inverter I50. Then, a signal BS<0:3> is output from an output portion of the OR circuit RR1. It should be noted that signals xBSILTC0-e, xBSILTC1-e, xBSILTC0-o and xBSILTC1-o indicate respectively that they are of one of those types which are logically inverting the signals BSILTC0-e, BSILTC1-e, BSILTC0-o and BSILTC1-o, or those which are not logically inverting these signals.

Next, the operation of the semiconductor memory will be described with reference to FIGS. 10 to 13.

Figure 10:
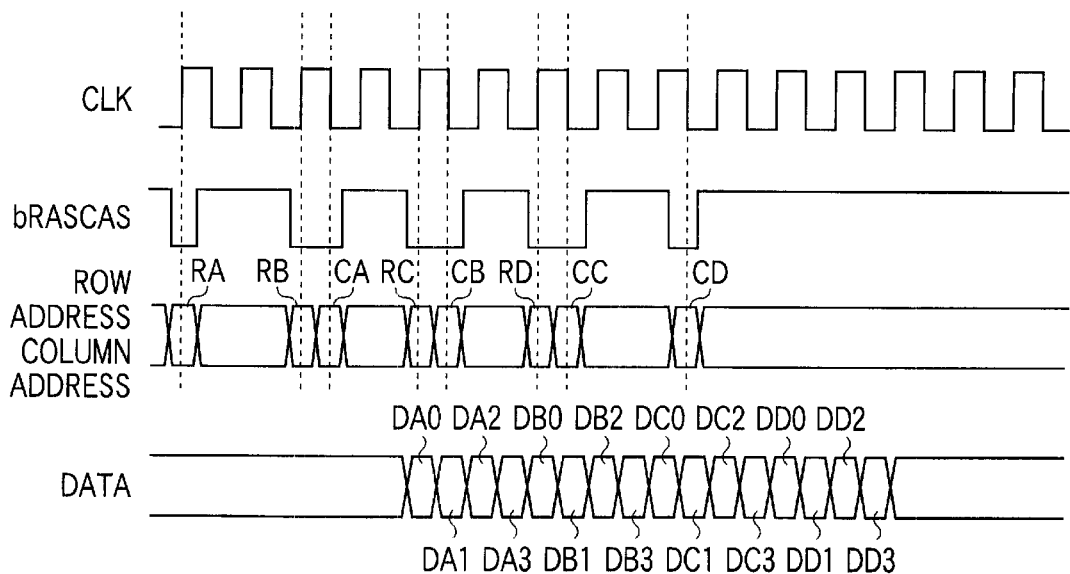
FIG. 10 is a time chart indicating an example of the read operation in the semiconductor memory.
Figure 11:
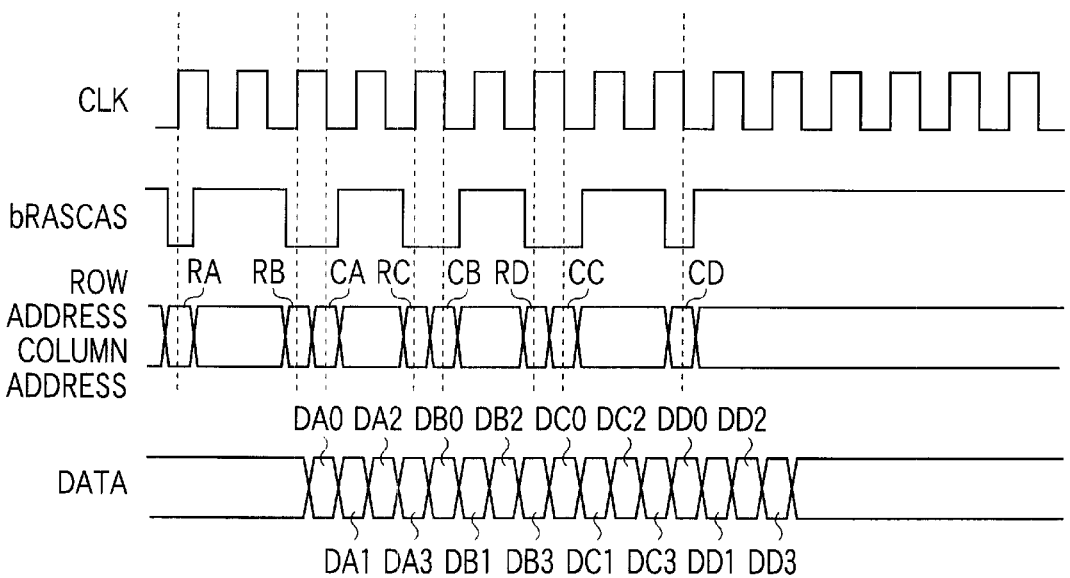
FIG. 11 is a time chart indicating an example of the write operation in the semiconductor memory.
Figure 12:
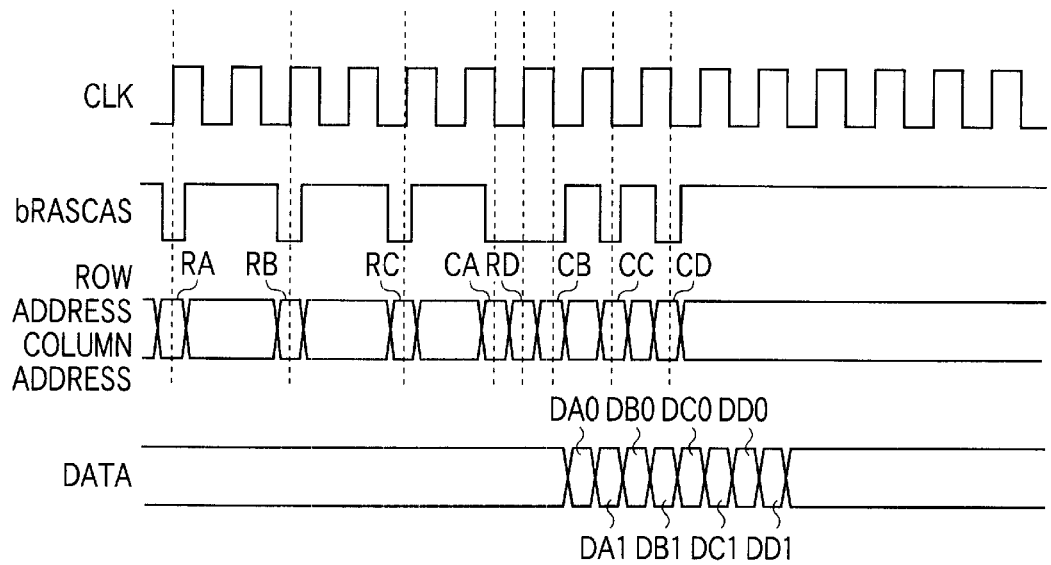
FIG. 12 is a time chart indicating another example of the read operation in the semiconductor memory.
Figure 13:
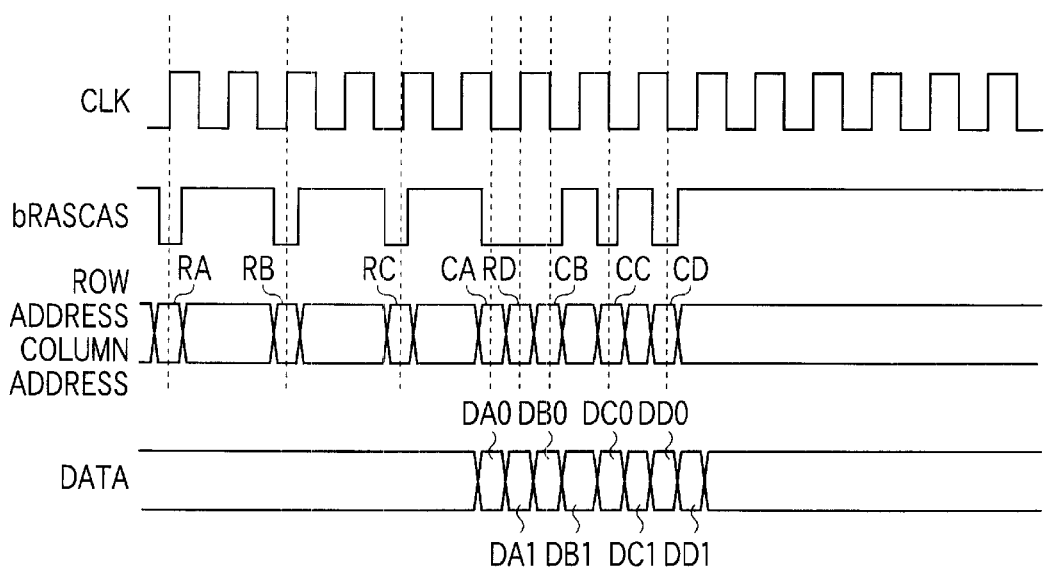
FIG. 13 is a time chart indicating another example of the write operation in the semiconductor memory.

FIG. 10 is a time chart illustrating a read-out operation in an interleave where the latency of the CAS signal is 2, the burst length is 4 and the number of banks is 4 and FIG. 11 is a time chart illustrating a write operation in an interleave where the latency of the CAS signal is 2, the burst length is 4 and the number of banks is 4. Further, FIG. 12 is a time chart illustrating a read-out operation in an interleave where the latency of the CAS signal is 2, the burst length is 2 and the number of banks is 4 and FIG. 13 is a time chart illustrating a write operation in an interleave where the latency of the CAS signal is 2, the burst length is 2 and the number of banks is 4.

First, the following is an explanation of the read-out operation in an interleave shown in FIG. 10 where the latency of the CAS signal is 2, the burst length is 4 and the number of banks is 4.

That is, as shown in FIG. 10, during a period where an address strobe signal bRASCAS becomes an "L" level, a row address RA is fetched in synchronism with a rising edge (a leading edge) of a clock signal CLK. Then, when the address strobe signal bRASCAS becomes an "L" level for the next time, a row address RB is fetched in synchronism with the rising edge of the clock signal, and then a column address CA is fetched in synchronism with a falling edge (a trailing edge) of the clock signal CLK.

Similarly, during a period where the address strobe signal bRASCAS becomes an "L" level for the next time, a row address RC is fetched in synchronism with a rising edge of the clock signal CLK, and then a column address CB is fetched in synchronism with the falling edge of the clock signal CLK. Similarly, during a period where the address strobe signal bRASCAS becomes an "L" level for the next time, a row address RD is fetched in synchronism with a rising edge of the clock signal CLK, and then a column address CC is fetched in synchronism with the falling edge of the clock signal CLK. Further, during a period where the address strobe signal bRASCAS becomes an "L" level for the next time, a column address CD is fetched in synchronism with a falling edge of the clock signal CLK.

With the above-described operations, once the column address CA is fetched, immediately after the second rise of the clock signal CLK, data DA0, DA1, DA2 and DA3 are output. Further, without a gap, data DB0, DB1, DB2 and DB3 are output to follow DA3. Then, similarly, without a gap, data DC0, DC1, DC2 and DC3 are output to follow DB3. Then, data DD0, DD1, DD2 and DD3 are output to follow DC3.

It should be noted that data DA0, DA1, DA2 and DA3 are data read in accordance with the row address RA and column address CA. Further, data DB0, DB1, DB2 and DB3 are those read in accordance with the row address RB and column address CB. Data DC0, DC1, DC2 and DC3 are data read in accordance with the row address RC and column address CC. Further, data DD0, DD1, DD2 and DD3 are those read in accordance with the row address RD and column address CD.

As described above, in one cycle of the clock signal CLK, the row address signal is fetched in synchronism with a rising edge, and the column address signal is fetched in synchronism with a falling edge. In this manner, it becomes possible to transfer data without a gap in random row accessing. As a result, the effective data transfer rate can be improved.

Next, the following is an explanation of the write operation in an interleave shown in FIG. 11 where the latency of the CAS signal is 2, the burst length is 4 and the number of banks is 4.

That is, as shown in FIG. 11, during a period where an address strobe signal bRASCAS becomes an "L" level, a row address RA is fetched in synchronism with a rising edge of a clock signal CLK. Then, during the address strobe signal bRASCAS becomes an "L" level for the next time, a row address RB is fetched in synchronism with the rising edge of the clock signal CLK, and then a column address CA is fetched in synchronism with the falling edge of the clock signal CLK.

Similarly, during a period where the address strobe signal bRASCAS becomes an "L" level for the next time, a row address RC is fetched in synchronism with a rising edge of the clock signal CLK, and then a column address CB is fetched in synchronism with the falling edge of the clock signal CLK. Similarly, during a period where the address strobe signal bRASCAS becomes an "L" level for the next time, a row address RD is fetched in synchronism with a rising edge of the clock signal CLK, and then a column address CC is fetched in synchronism with the falling edge of the clock signal CLK. Further, during a period where the address strobe signal bRASCAS becomes an "L" level for the next time, a column address CD is fetched in synchronism with a falling edge of the clock signal CLK.

With the above-described operations, from immediately after the column address CA is fetched, data DA0, DA1, DA2 and DA3 are written. Further, without a gap, data DB0, DB1, DB2 and DB3 are written to follow DA3. Then, similarly, without a gap, data DC0, DC1, DC2 and DC3 are written to follow DB3. Then, data DD0, DD1, DD2 and DD3 are written to follow DC3.

It should be noted that data DA0, DA1, DA2 and DA3 are written successively in four addresses whose leading address is selected in accordance with the row address RA and column address CA. Further, data DB0, DB1, DB2 and DB3 are written successively in four addresses whose leading address is selected in accordance with the row address RB and column address CB. Data DC0, DC1, DC2 and DC3 are written successively in four addresses whose leading address is selected in accordance with the row address RC and column address CC. Further, data DD0, DD1, DD2 and DD3 are written successively in four addresses whose leading address is selected in accordance with the row address RD and column address CD.

As described above, in one cycle of the clock signal CLK, the row address signal is fetched in synchronism with a rising edge, and the column address signal is fetched in synchronism with a falling edge. In this manner, it becomes possible to transfer data without a gap in random row accessing. As a result, the effective data transfer rate can be improved.

Next, the following is an explanation of the read-out operation in an interleave shown in FIG. 12 where the latency of the CAS signal is 2, the burst length is 2 and the number of banks is 4.

That is, as shown in FIG. 12, during a period where an address strobe signal bRASCAS becomes an "L" level, a row address RA is fetched in synchronism with a rising edge of a clock signal CLK. Then, during the address strobe signal bRASCAS becomes an "L" level for the next time, a row address RB is fetched in synchronism with the rising edge of the clock signal CLK. Further, during the address strobe signal bRASCAS becomes an "L" level for the next time, a row address RC is fetched in synchronism with the rising edge of the clock signal.

Furthermore, during a period where the address strobe signal bRASCAS becomes an "L" level for the next time, a column address CA is fetched in synchronism with a falling edge of the clock signal CLK, then a row address RD is fetched in synchronism with the rising edge of the clock signal CLK, and then a column address CB is fetched in synchronism with the falling edge of the clock signal CLK. Further, during a period where the address strobe signal bRASCAS becomes an "L" level for the next time, a column address CC is fetched in synchronism with the falling edge of the clock signal CLK. Then, during a period where the address strobe signal bRASCAS becomes an "L" level for the next time, a column address CD is fetched in synchronism with a falling edge of the clock signal CLK.

With the above-described operations, once the column address CA is fetched, immediately after the second rise of the clock signal, data DA0 and DA1 are output. Further, without a gap, data DB0 and DB1 are output to follow DA1. Then, similarly, without a gap, data DC0 and DC1 are output to follow DB1. Then, data DD0 and DD1 are output to follow DC1.

It should be noted that data DA0 and DA1 are data read in accordance with the row address RA and column address CA. Further, data DB0 and DB1 are those read in accordance with the row address RB and column address CB. Data DC0 and DC1 are data read in accordance with the row address RC and column address CC. Further, data DD0 and DD1 are those read in accordance with the row address RD and column address CD.

As described above, the row address signal is fetched in synchronism with a rising edge of the clock signal CLK, and the column address signal is fetched in synchronism with a falling edge of the clock signal CLK. In this manner, it becomes possible to transfer data without a gap in random row accessing. As a result, the effective data transfer rate can be improved.

Next, the following is an explanation of the read-out operation in an interleave shown in FIG. 13 where the latency of the CAS signal is 2, the burst length is 2 and the number of banks is 4.

That is, as shown in FIG. 13, during a period where an address strobe signal bRASCAS becomes an "L" level, a row address RA is fetched in synchronism with a rising edge of a clock signal CLK. Then, during the address strobe signal bRASCAS becomes an "L" level for the next time, a row address RB is fetched in synchronism with the rising edge of the clock signal CLK. Further, during the address strobe signal bRASCAS becomes an "L" level for the next time, a row address RC is fetched in synchronism with the rising edge of the clock signal CLK.

Furthermore, during a period where the address strobe signal bRASCAS becomes an "L" level for the next time, a column address CA is fetched in synchronism with a falling edge of the clock signal CLK, then a row address RD is fetched in synchronism with the rising edge of the clock signal CLK, and then a column address CB is fetched in synchronism with the falling edge of the clock signal CLK. Further, during a period where the address strobe signal bRASCAS becomes an "L" level for the next time, a column address CC is fetched in synchronism with the falling edge of the clock signal CLK. Then, during a period where the address strobe signal bRASCAS becomes an "L" level for the next time, a column address CD is fetched in synchronism with a falling edge of the clock signal CLK.

With the above-described operations, immediately after the column address CA is fetched, data DA0 and DA1 are written. Further, without a gap, data DB0 and DB1 are written to follow DA1. Then, similarly, without a gap, data DC0 and DC1 are written to follow DB1. Then, data DD0 and DD1 are written to follow DC1.

It should be noted that data DA0 and DA1 are written successively in two addresses whose leading address is selected in accordance with the row address RA and column address CA. Further, data DB0 and DB1 are written successively in two addresses whose leading address is selected in accordance with the row address RB and column address CB. Data DC0 and DC1 are written successively in two addresses whose leading address is selected in accordance with the row address RC and column address CC. Further, data DD0 and DD1 are those read in accordance with the row address RD and column address CD.

As described above, the row address signal is fetched in synchronism with a rising edge of the clock signal CLK, and the column address signal is fetched in synchronism with a falling edge of the clock signal CLK. In this manner, it becomes possible to transfer data without a gap in random row accessing. As a result, the effective data transfer rate can be improved.

According to the embodiment discussed above, not only input/output of data, but also the command signals, that is, the address signal, bank selection signal, row address strobe signal bRAS, column address strobe signal bCAS, chip select signal bCS and write enable signal bWE, are handled by DDR. In this manner, it becomes possible to transfer data without a gap in random row accessing. As a result, the effective data transfer rate can be improved.

Further, when such a limitation is set that a row address is fetched at a rising edge of a clock signal and a column address is fetched at a falling edge of the clock signal, it becomes possible to reduce the number of signals RAS and CAS, that is, 2 in the conventional SDRAM case, to only 1, or reduce the 4-bit signal conventionally used in decoding of a command to a 3-bit signal. In this manner, the structure of the circuit of the command decoder can be simplified, and it becomes possible to reduce the layout area for the circuit, increase the processing speed and realize a low-consumption power.

In a conventional synchronous DRAM (DDR-SDRAM), a row address and a column address cannot be given at the same time, and therefore gaps are created while transferring data especially when row addresses are input at random. In the embodiment, the fetching of address signals are done in DDR, and the row address signal is fetched in synchronism with a rising signal of a clock and the column address signal is fetched in synchronism with a falling signal of a clock. With these settings, a gap created while transferring data by the conventional synchronous DRAM can be erased, thereby making it possible to enhance the efficiency of data transfer.

Further, according to the embodiment, such a limitation is set that a row address is fetched at a rising edge of a clock signal and a column address is fetched at a falling edge of a clock signal, and therefore it becomes possible to reduce the number of signals bRAS and bCAS input to the conventional SDRAM to only 1. In this manner, the structure of the circuit of the command decoder can be simplified, and the layout area for the circuit can be reduced, and a low-consumption power can be realized.

As described in the above embodiment, when such setting is made that the row address signal is fetched in synchronism with a rising edge of a clock signal and the column address signal is fetched in synchronism with a falling edge of a clock, a gap created while transferring data by the conventional synchronous DRAM can be erased, thereby making it possible to enhance the efficiency of data transfer without preparing address pins, address buses and address buffers provided separately and exclusively for row address and column address.

To summarize, according to the present invention, in a semiconductor memory which carries out a DDR (double data rate) operation, especially, DRAM, not only input/output of data, but also the command signals, that is, the address signal, bank selection signal, row address strobe signal bRAS, column address strobe signal bCAS, chip select signal bCS and write enable signal bWE, are handled by DDR. In this manner, it becomes possible to improve the effective data transfer rate. Further, not simply handling these signals in the DDR mode, but each signal is handled in accordance with its role of the signal, that is, for example, some signals are limited such that they are fetched in synchronism with rising edges of external clock signals, while others are fetched in synchronism with falling edges of external clock signals. In this manner, the number of signals input from outside can be reduced. Thus, the circuit can be simplified in structure, and the chip area can be reduced and the circuit operation speed can be increased.

As described above, according to the present invention, it is possible to provide a semiconductor memory capable of enhancing the data transfer efficiency and increasing the circuit operation speed without increasing its chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a memory cell for storing data, said memory cell being designated by an address signal;
   an address fetch circuit for fetching said address signal for designating said memory cell in synchronism with both of a leading edge and a trailing edge of a clock signal, said clock signal for providing timing for access to said memory cell; and
   a command circuit for fetching a command signal for instructing said access to said memory cell in synchronism with both of said leading edge and said trailing edge of said clock signal.

2. A semiconductor memory according to claim 1, wherein said address signal contains a row address signal for designating a row address, and a column address signal for designating a column address, and said address fetch circuit fetches said row address signal in synchronism with either one of said leading edge and said trailing edge of said clock signal, and fetches said column address signal in synchronism with an other edge which comes after said one of edges, which is different from said one of said edges, with which said row address signal is fetched.

3. A semiconductor memory according to claim 2, wherein a row address strobe signal for regulating a fetching period of said row address signal, and a column address strobe signal for regulating a fetching period of said column address signal are supplied to said address fetch circuit, and said address fetch circuit fetches said row address signal when said row address strobe signal is at a certain value, and fetches said column address signal when said column address strobe signal is at a certain value.

4. A semiconductor memory according to claim 3, wherein said row address strobe signal and said column address strobe signal are replaced by an address strobe signal.

5. A semiconductor memory according to claim 2, wherein an address strobe signal for regulating a fetching period of said row address signal and said column address signal is supplied to said address fetch circuit, and said address fetch circuit fetch said row address signal and said column address signal when said address strobe signal is at a certain value.

6. A semiconductor memory according to claim 1, wherein an address strobe signal for regulating a fetching period of said address signal is supplied to said address fetch circuit, and said address fetch circuit fetches said address signal when said address strobe signal is at a certain value.

7. A semiconductor memory according to claim 1, wherein said access to said memory cell instructed by said command signal is at least one of read and write of data with respect to said memory cell.

8. A semiconductor memory comprising:
- a memory cell for storing data, said memory cell being designated by an address signal;
- a clock generating circuit for generating a clock signal used for providing timing for an access to said memory cell, said clock signal having a leading edge and a trailing edge;
- a first holding circuit for holding said address signal for designating said memory cell in synchronism with either one of a leading edge and a trailing edge of said clock signal;
- a second holding circuit for holding said address signal in synchronism with an other edge which comes after said one of edges, which is different from said one of said edges, used by said first holding circuit to hold said address signal;
- a first decoding circuit for decoding said address signal held by said first holding circuit; and
- a second decoding circuit for decoding said address signal held by said second holding circuit.

9. A semiconductor memory according to claim 8, further comprising:
- a third holding circuit for holding a command signal for instructing said access to said memory cell, in synchronism with either one of a leading edge and a trailing edge of said clock signal; and
- a fourth holding circuit for holding said command signal, in synchronism with an other edge which comes after said one of edges, which is different from said one of said edges, used by said first holding circuit to hold said address signal.

10. A semiconductor memory according to claim 9, wherein said access to said memory cell instructed by said command signal is at least one of read and write of data with respect to said memory cell.

11. A semiconductor memory according to claim 8, wherein said address signal contains a row address signal for designating a row address, and a column address signal for designating a column address, and said first holding circuit holds said row address signal and said second holding circuit holds said column address signal.

12. A semiconductor memory according to claim 11, wherein a row address strobe signal for regulating a fetching period of said row address signal, and a column address strobe signal for regulating a fetching period of said column address signal are supplied to said first and second holding circuits, and said first holding circuit holds said row address signal when said row address strobe signal is at a certain value, and said second holding circuit holds said column address signal when said column address strobe signal is at a certain value.

13. A semiconductor memory according to claim 12, wherein said row address strobe signal and said column address strobe signal are replaced by an address strobe signal.

14. A semiconductor memory according to claim 11, wherein an address strobe signal for regulating a fetching period of said row address signal and said column address signal is supplied to said first and second holding circuits, and said first and second holding circuits fetch said row address signal and said column address signal, respectively, only when said address strobe signal is at a certain value.

15. A semiconductor memory according to claim 8, wherein an address strobe signal for regulating a fetching period of said address signal is supplied to said first and second holding circuits, and said first and second holding circuits hold said address signal, only when said address strobe signal is at a certain value.

16. A semiconductor memory comprising:
- a memory cell for storing data;
- a clock generating circuit for generating a clock signal used for providing timing for an access to said memory cell, said clock signal having a leading edge and a trailing edge;
- a first holding circuit for holding a command signal for instructing said access to said memory cell in synchronism with either one of said leading edge and said trailing edge of said clock signal;
- a second holding circuit for holding said command signal in synchronism with an other edge which comes after said one of edges, which is different from said one of said edges, used by said first holding circuit to hold said command;
- a first decoding circuit for decoding said command signal held by said first holding circuit; and
- a second decoding circuit for decoding said command signal held by said second holding circuit.

17. A semiconductor memory according to claim 16, wherein said access to said memory cell instructed by said command signal is at least one of read and write of data with respect to said memory cell.

* * * * *